US006340899B1

(12) United States Patent
Green

(10) Patent No.: US 6,340,899 B1
(45) Date of Patent: Jan. 22, 2002

(54) CURRENT-CONTROLLED CMOS CIRCUITS WITH INDUCTIVE BROADBANDING

(75) Inventor: Michael M. Green, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 09/610,905

(22) Filed: Jul. 6, 2000

Related U.S. Application Data

(60) Provisional application No. 60/184,703, filed on Feb. 24, 2000.

(51) Int. Cl.$^7$ ................. H03K 19/064; H03K 19/0175; G01R 19/00
(52) U.S. Cl. ............................. 326/115; 326/83; 327/52
(58) Field of Search ...................... 326/115, 83, 86–88, 326/112, 119, 121; 327/52, 50, 65, 81, 89

(56) References Cited

U.S. PATENT DOCUMENTS

| | | | | |
|---|---|---|---|---|
| 5,177,378 A | * | 1/1993 | Nagasawa ................... 326/83 |
| 5,301,196 A | | 4/1994 | Ewen et al. ............. 370/105.2 |
| 5,548,230 A | | 8/1996 | Gerson et al. ................ 326/73 |
| 5,905,386 A | | 5/1999 | Gerson ........................ 326/73 |
| 5,945,847 A | * | 8/1999 | Ransijn ....................... 326/115 |
| 5,945,863 A | | 8/1999 | Coy ............................ 327/280 |
| 6,002,279 A | | 12/1999 | Evans et al. ................. 327/144 |
| 6,037,841 A | | 3/2000 | Tanji et al. .................. 330/308 |
| 6,037,842 A | | 3/2000 | Bryan et al. .................. 331/57 |
| 6,104,214 A | * | 8/2000 | Ueda et al. ................. 326/115 |

FOREIGN PATENT DOCUMENTS

JP        363280517 A   *  11/1988

OTHER PUBLICATIONS

Thomas H. Lee, "The Design of CMOS Radio–Frequency Integrated Circuits," 1998, Cambridge Press, New York, N.Y., pp. 178–185.

* cited by examiner

Primary Examiner—Michael Tokar
Assistant Examiner—James H Cho
(74) Attorney, Agent, or Firm—Townsend and Townsend and Crew LLP

(57) ABSTRACT

Various circuit techniques for implementing ultra high speed circuits use current-controlled CMOS (C$^3$MOS) logic with inductive broadbanding fabricated in conventional CMOS process technology. Optimum balance between power consumption and speed for each circuit application is achieve by combining high speed C$^3$MOS logic with inductive broadbanding/C$^3$MOS logic with low power conventional CMOS logic. The combined C$^3$MOS logic with inductive broadbanding/C$^3$MOS/CMOS logic allows greater integration of circuits such as high speed transceivers used in fiber optic communication systems.

9 Claims, 12 Drawing Sheets

CURRENT-CONTROLLED CMOS CIRCUITS WITH INDUCTIVE BROADBANDING

CROSS-REFERENCES TO RELATED APPLICATIONS

This application is a continuation of and claims the benefit of U.S. provisional patent application No. 60/184,703, filed Feb. 24, 2000, the disclosure of which is incorporated herein by reference.

BACKGROUND OF THE INVENTION

The present invention relates in general to high speed logic circuitry, and in particular to current-controlled CMOS (or $C^3MOS^{TM}$) logic circuits with inductive broadbanding.

For a number of reasons CMOS is the logic family of choice in today's VLSI devices. Due to the complementary nature of its operation, CMOS logic consumes zero static power. CMOS also readily scales with technology. These two features are highly desirable given the drastic growth in demand for low power and portable electronic devices. Further, with the computer aided design (CAD) industry's focus on developing automated design tools for CMOS based technologies, the cost and the development time of CMOS VLSI devices has reduced significantly.

The one drawback of the CMOS logic family, however, remains its limited speed. That is, conventional CMOS logic has not achieved the highest attainable switching speeds made possible by modem sub-micron CMOS technologies. As a result of the speed limitations of conventional CMOS logic, integrated circuit applications in the Giga Hertz frequency range have had to look to alternative technologies such as ultra high speed bipolar circuits and Gallium Arsenide (GaAs). These alternative technologies, however, have drawbacks of their own that have made them more of a specialized field with limited applications as compared to silicon MOSFET that has had widespread use and support by the industry. In particular, compound semiconductors such as GaAs are more susceptible to defects that degrade device performance, and suffer from increased gate leakage current and reduced noise margins. Furthermore, attempts to reliably fabricate a high quality oxide layer using GaAs have not thus far met with success. This has made it difficult to fabricate GaAs FETs, limiting the GaAs technology to junction field-effect transistors (JFETs) or Schottky barrier metal semiconductor field-effect transistors (MESFETs). A major drawback of the bipolar technology, among others, is its higher current dissipation even for circuits that operate at lower frequencies.

SUMMARY OF THE INVENTION

A significant improvement in speed of operation of CMOS circuitry has been achieved by a family of CMOS logic that is based on current-controlled mechanism. Current-controlled CMOS (or $C^3MOS$) logic is described in greater detail in commonly-assigned patent application Ser. No. 09/484,856 entitled "Current-Controlled CMOS Logic Family," by Hairapetian, which is hereby incorporated in its entirety for all purposes. The basic building block of the $C^3MOS$ logic family uses a pair of conventional MOSFETs that steer current between a pair of load devices in response to a difference between a pair of input signals. Thus, unlike conventional CMOS logic, $C^3MOS$ logic dissipates static current, but operates at much higher speeds.

According to one aspect of the invention, to further enhance speed of operation of circuits implemented in CMOS technology, the present invention introduces inductive elements in the $C^3MOS$ circuits. In a specific embodiment, a spiral inductor is inserted in series with the load devices of selected $C^3MOS$ structures that process high-bandwidth data signals. The resulting series combination of inductor and resistive element (e.g., polysilicon resistors) that is in parallel with an existing capacitive load provides a high impedance at a higher bandwidth than would be possible without the presence of the inductor. Optimized values for the inductors ensure appropriate placement of the circuit's natural frequencies in the complex plane to achieve fast rise and fall times with appropriate overshoot and undershoot. The present invention combines the use of this type of shunt peaking with $C^3MOS$ circuits that process broadband bi-level (i.e., digital as opposed to analog) differential signals. The combination of these characteristics allows for improvement of the output signal's inter-symbol interference without any increase in power dissipation.

According to another aspect of the invention, a multiplexer circuit includes $C^3MOS$ with inductive broadbanding to facilitate operation at ultra-high frequencies.

According to another aspect of the invention, a flip-flop is implemented utilizing $C^3MOS$ with inductive broadbanding to operate at ultra-high frequencies.

According to another aspect of the invention, a complementary metal-oxide-semiconductor (CMOS) logic circuitry combines on the same silicon substrate, current-controlled MOSFET circuitry of the type described above for high speed signal processing, with conventional CMOS logic that does not dissipate static current. Examples of such combined circuitry include serializer/deserializer circuitry used in high speed serial links, high speed phase-locked loop dividers, and the like.

Other features and advantages of the invention will be apparent in view of the following detailed description and appended drawings.

DESCRIPTION OF THE SPECIFIC EMBODIMENTS

The present invention provides ultra high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide. CMOS logic, on the other hand, refers to the use of complementary CMOS transistors (n-channel and p-channel) to form various logic gates and more complex logic circuitry, wherein zero static current is dissipated. The present invention uses current-controlled mechanisms with inductive broadbanding to develop a family of very fast current-controlled CMOS (or C³MOS™) with inductive broadbanding logic that can be fabricated using a variety of conventional CMOS process technologies, but that unlike conventional CMOS logic does dissipate static current. C³MOS with inductive broadbanding logic or current-controlled metal-oxide-semiconductor field-effect transistor (MOSFET) logic are used herein interchangeably.

In a preferred embodiment, the basic building block of this logic family is an NMOS differential pair with series connected inductive/resistive (LR) loads.

Figure 1:
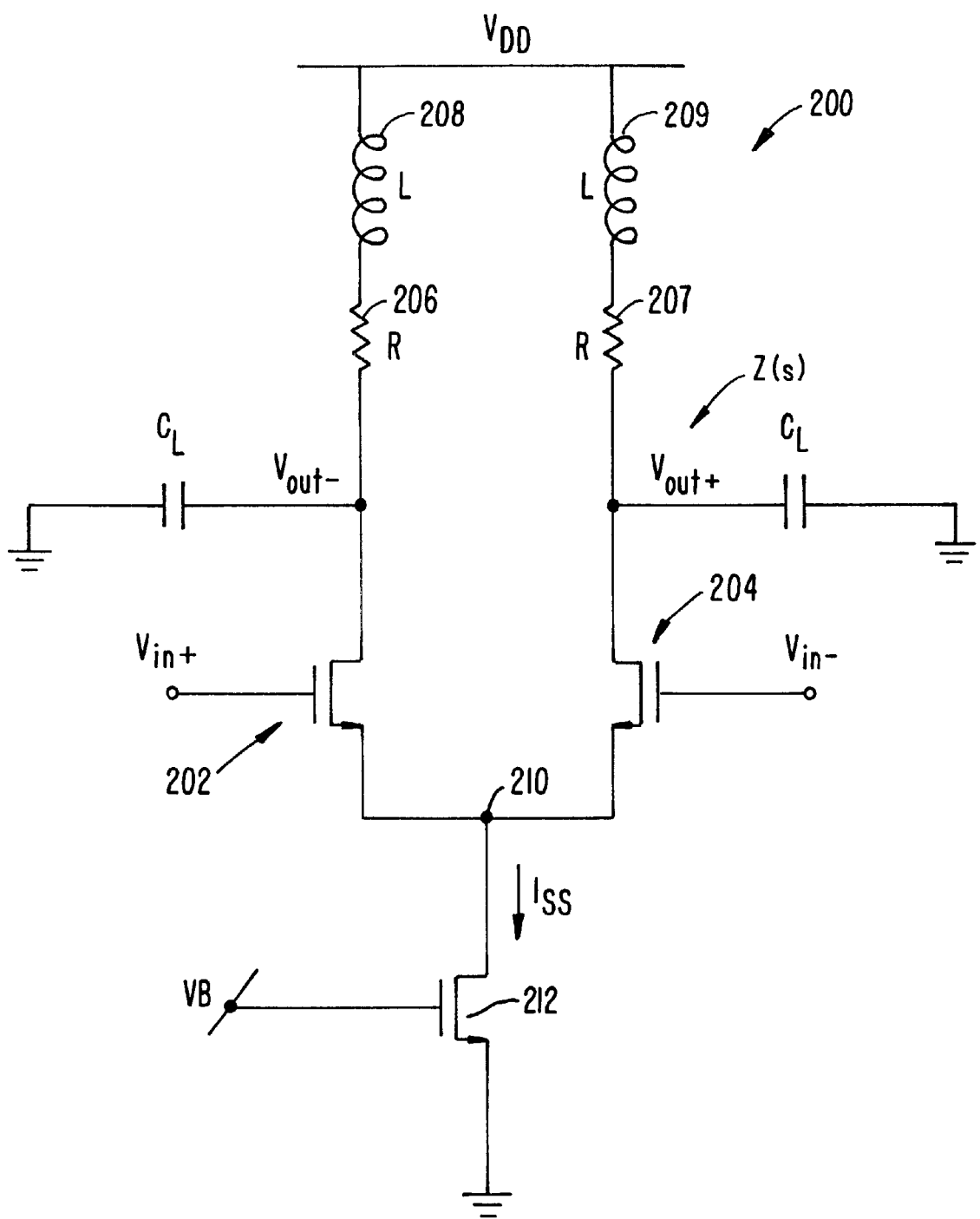
FIG. 1 is a schematic diagram of differential pair including inductive broadbanding implemented with CMOS technology.

FIG. 1 illustrates the basic C³MOS differential pair 200 with shunt inductors L, and load capacitors $C_L$. A pair of n-channel MOSFETs 202 and 204 receive differential logic signals $V_{in}+$ and $V_{in}-$ at their gate terminals, respectively. Resistive loads 206 and 207 in series with shunt inductors 208 and 209 connect the drain terminals of MOSFETs 202 and 204, respectively, to the power supply VDD. Drain terminals of MOSFETs 202 and 204 form the outputs $V_{out}-$ and $V_{out}-$ of the differential pair, respectively. In a preferred embodiment, the shunt inductors 208 and 209 are spiral inductors coupled to the substrate utilizing standard techniques. Resistive loads 206 and 207 may be made up of either p-channel MOSFETs operating in their linear region, or resistors made up of, for example, polysilicon material. In a preferred embodiment, polysilicon resistors are used to implement resistive loads 206 and 207, which maximizes the speed of differential pair 200. The source terminals of n-channel MOSFETs 202 and 204 connect together at node 210. A current-source n-channel MOSFET 212 connects node 210 to ground (or negative power supply). A bias voltage VB drives the gate terminal of current source MOSFET 212 and sets up the amount of current I that flows through differential pair 200. In response to the differential signal at $V_{in}+$ and $V_{in}-$ one of the two input n-channel MOSFETs 202 and 204 switches on while the other switches off. All of current I, thus flows in one leg of the differential pair pulling the drain terminal ($V_{out}+$ or $V_{out}-$) of the on transistor down to logic low, while the drain of the other (off) transistor is pulled up toward logic high. Shunt peaking, according to the present invention, can be selectively applied to those parts of an integrated circuit that require the bandwidth enhancement.

In FIG. 1, the input levels $V_{in}+$ and $V_{in}-$ vary symmetrically in opposite directions when a digital signal is received. For example if $V_{in}+$ swung positive then $V_{in}-$ would swing negative. The voltage levels at $V_{out}-$ and $V_{out}+$ swing in the same direction as the respective input signal levels. For reasons described more fully below, for broadband signals including frequencies in the range of over 5 GigaHz the transient response of the circuit must be fast.

Figure 2A:
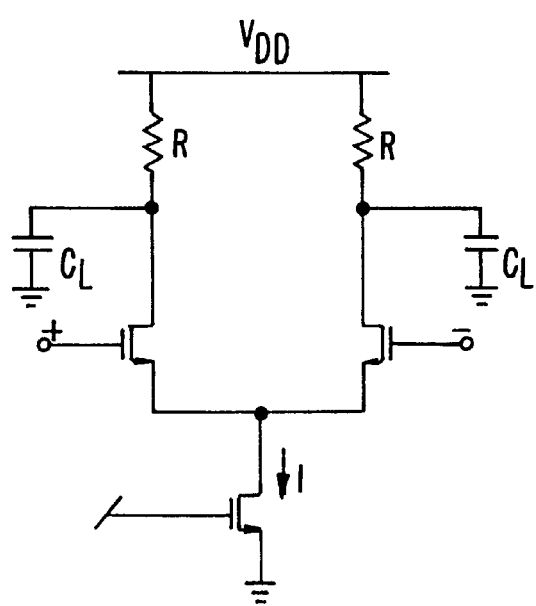
FIG. 2(a) is a schematic diagram of the circuit of FIG. 1 without the shunt inductor.
Figure 2B:
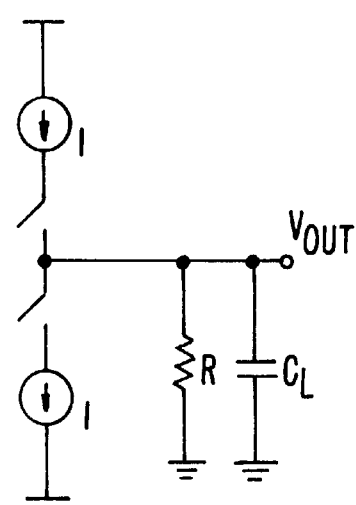
FIG. 2(b) is a simplified diagram depicting the transient behavior of the circuit of FIG. 2(a)
Figure 2C:
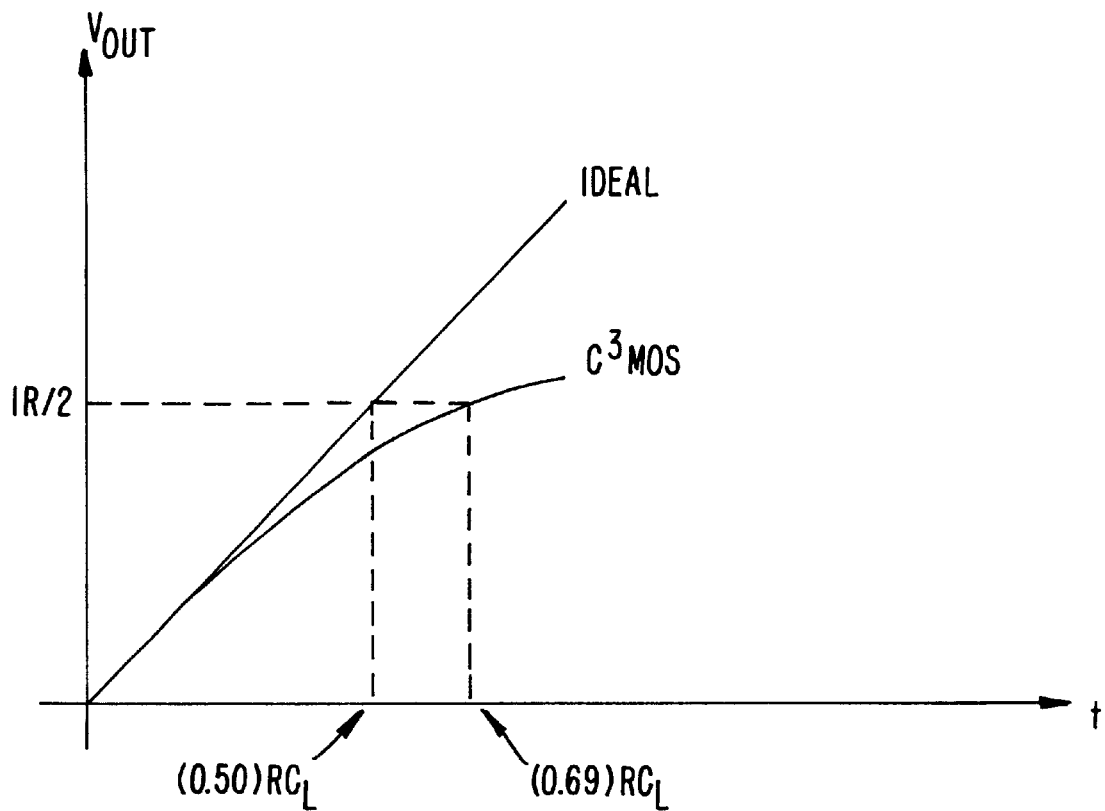
FIG. 2(c) is a graph depicting the difference between ideal and $C^3MOS$ step responses.

FIGS. 2(a) and (b) respectively depict the circuit of FIG. 1 with the inductors removed, resulting in a C³MOS buffer, and a simple equivalent circuit illustrating the transient behavior of the circuit. In this case the output transient waveform is characterized by an exponential waveform with a time constant RC. This waveform is depicted in FIG. 2(c) with a label "C³MOS" and has an initial slope of $I/C_L$. The difference between the ideal and exponential step response is also depicted in FIG. 2(c).

In the circuit of FIG. 2(a) the transient response of the output signal would be controlled by the RC time constant. It is clear from FIG. 2(c) that the presence of the load resistor significantly slows down the transient step response. Thus, when an input signal is received with a very fast rise time the current increases rapidly to charge or discharge the load capacitor. However, the transient response of the output signal is controlled by the RC time constant and can have a longer rise time than the input pulse.

Now, considering the circuit as disclosed in FIG. 1, including the inductors, as is well-known in the art an inductor resists a change in current. Thus, when the drain current changes in response to an input signal the inductor chokes off current flow through the resistor so that the capacitor discharges rapidly to generate an output signal with a small rise time.

Figure 3:
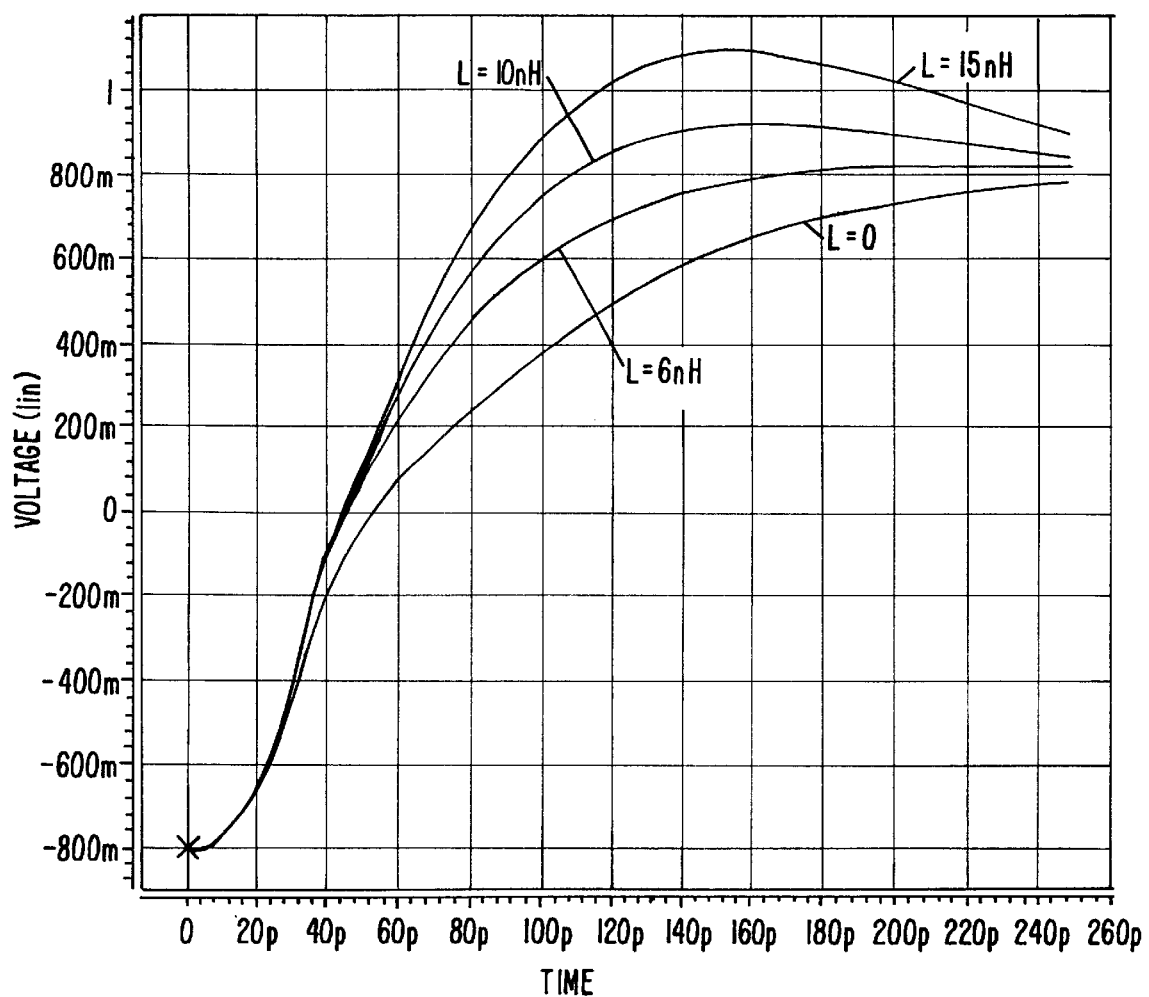
FIG. 3 is a graph depicting the step response of the circuit of FIG. 1 for four values of series inductance.

The larger the value of series inductance, the longer the full value of the current is available to charge/discharge the load capacitances. FIG. 3 shows the step response for 4 different values of series inductance.

From FIG. 3 it is clear that higher values of inductance decrease the rise time. However, if the inductance value becomes too large, an excessive overshoot will occur. To determine the optimum value of inductance, the pulse response for a set of input pulses is observed with varying pulse widths. The graphs in FIG. 4(a) show the relative error between output and input pulse widths (referred to as intersymbol interference or ISI) for 4 values of inductance.

Figure 4A:
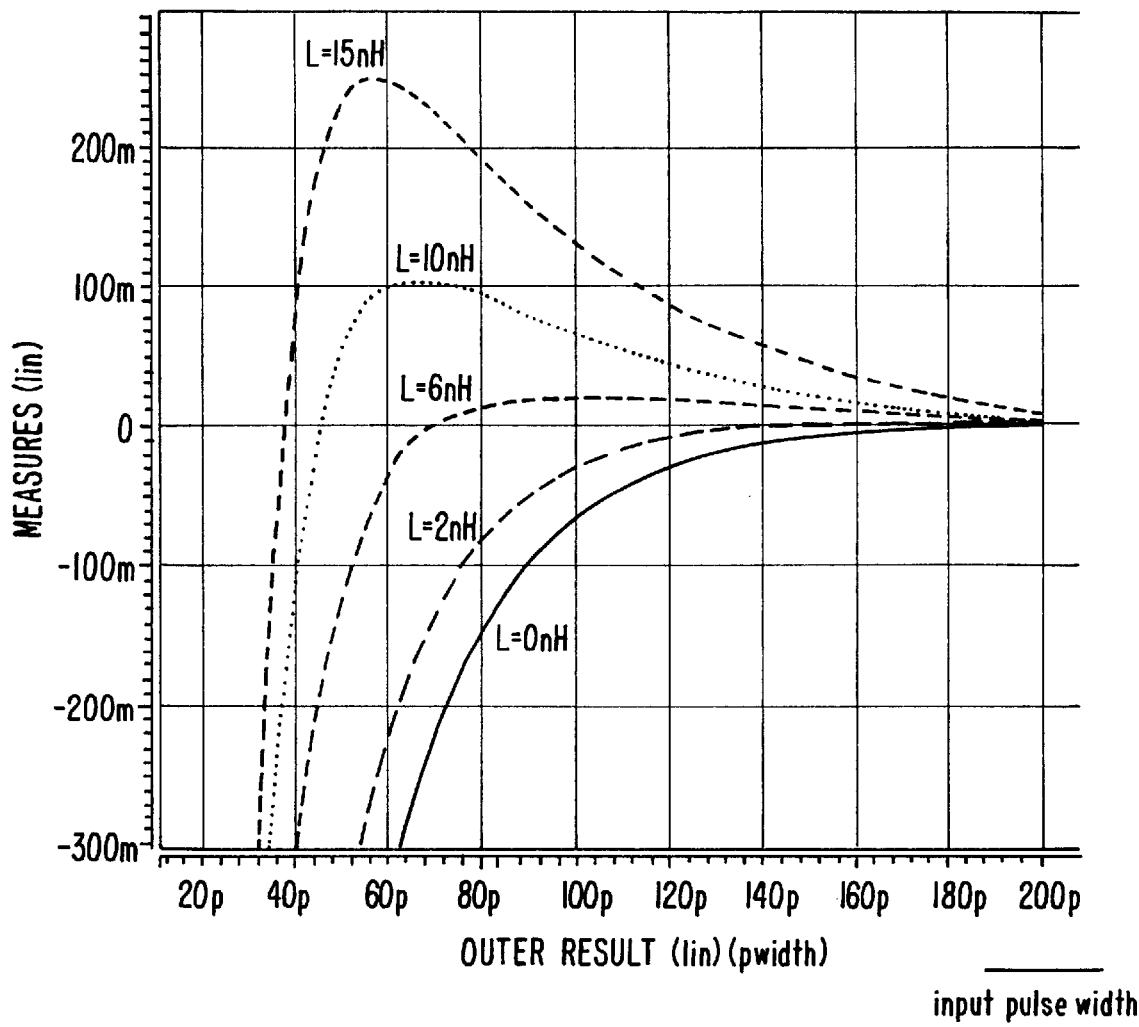
FIG. 4(a) is a graph depicting inter-symbol interference (ISI) vs. input pulse width for five values of series inductance.

From the FIG. 4(a) graphs it is apparent that given the values of R and $C_L$, the optimum inductor value is given by:

$$L_{S(opt)} = (0.35) * C_L R^2$$

Figure 4B:
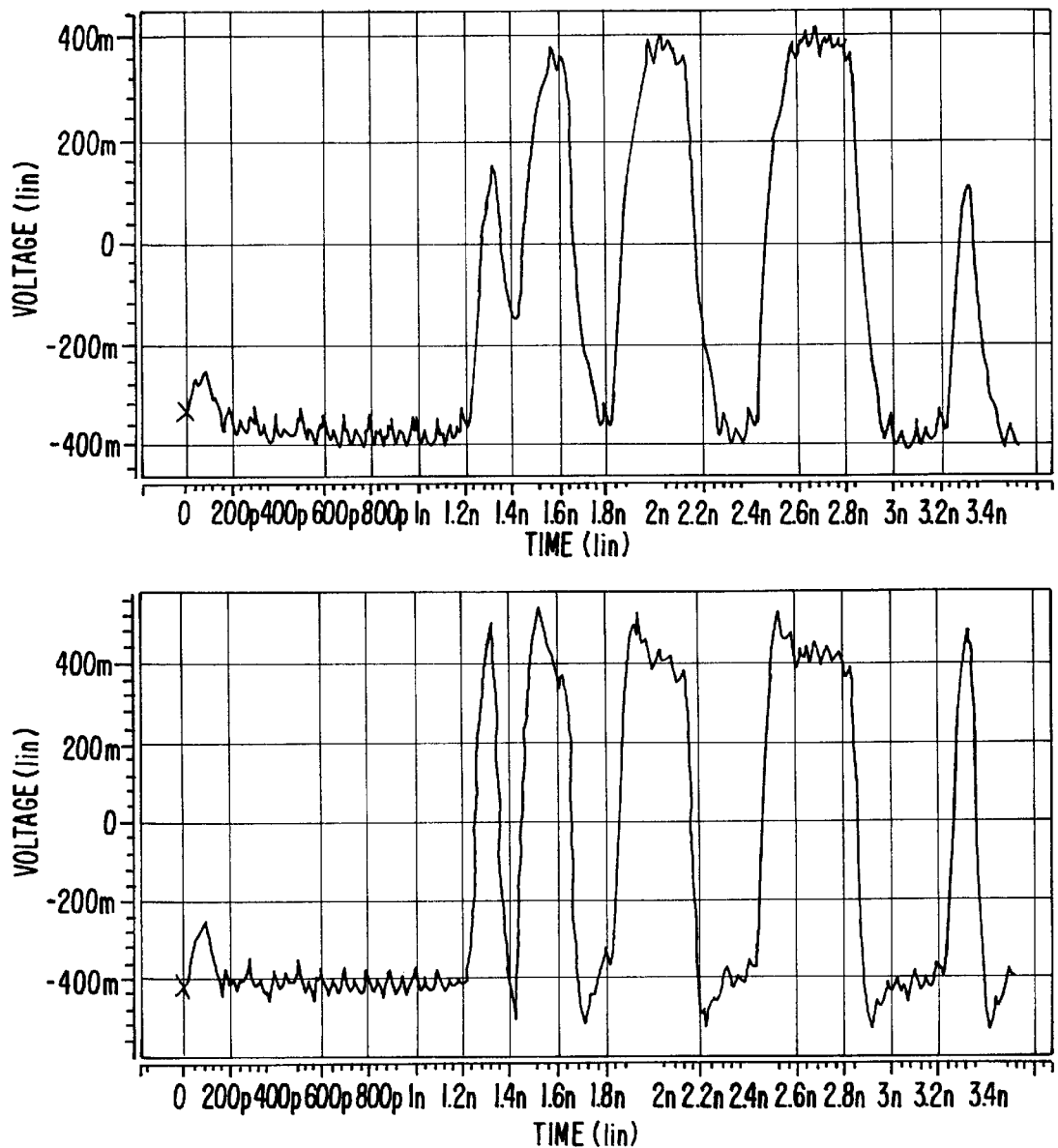
FIG. 4(b) is a graph depicting the output signal of the circuit of FIG. 1 with and without inductors.

FIG. 4(b) depicts the output signals for the circuit of FIG. 1 with and without the inductors. The magnitude of the time intervals between zero crossing points of the output signal provide important information for interpreting the input signal. As depicted in FIG. 4(b), the slope of the waveform zero-crossings is sharper when the inductors are included in the circuit thereby more precisely defining the time intervals between zero-crossing points and reducing inter-symbol interference.

In one embodiment of the present invention a transceiver circuit along a fiber optic channel deserializes an input data stream with a bit rate of, for example, 10 Gb/s. After processing the lower frequency deserialized data, the data is serialized before transmission back onto the fiber channel.

According to the present invention, those parts of this circuitry that process the highest speed data (e.g., input to the deserializer and output of the serializer) are implemented by C³MOS circuitry with inductive broadbanding.

Figure 5:
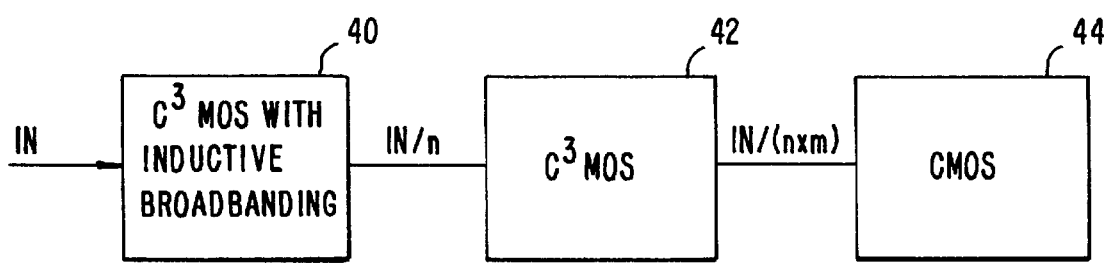
FIG. 5 is shows a block diagram for a circuit that combines $C^3MOS$ with inductive broadbanding, $C^3MOS$, and conventional CMOS logic on a single silicon substrate to achieve optimum tradeoff between speed and power consumption.

FIG. 5 shows a simplified block diagram illustrating this exemplary embodiment of the invention. A C³MOS with inductive broadbanding input circuit 40 receives a high frequency input signal IN and outputs a first divided down version of the signal IN/n. A C³MOS MUX 42 then receives this first divided down version and divides the received signal down by another factor of m to output a second divided down version of the signal IN/(n×m). The lower frequency signal IN/(n×m) is then processes by core circuitry 44 that is implemented in conventional CMOS logic. The low frequency signal from the core logic is then increased in frequency by the reverse process to form an output signal at the original high input frequency.

Figure 6A:
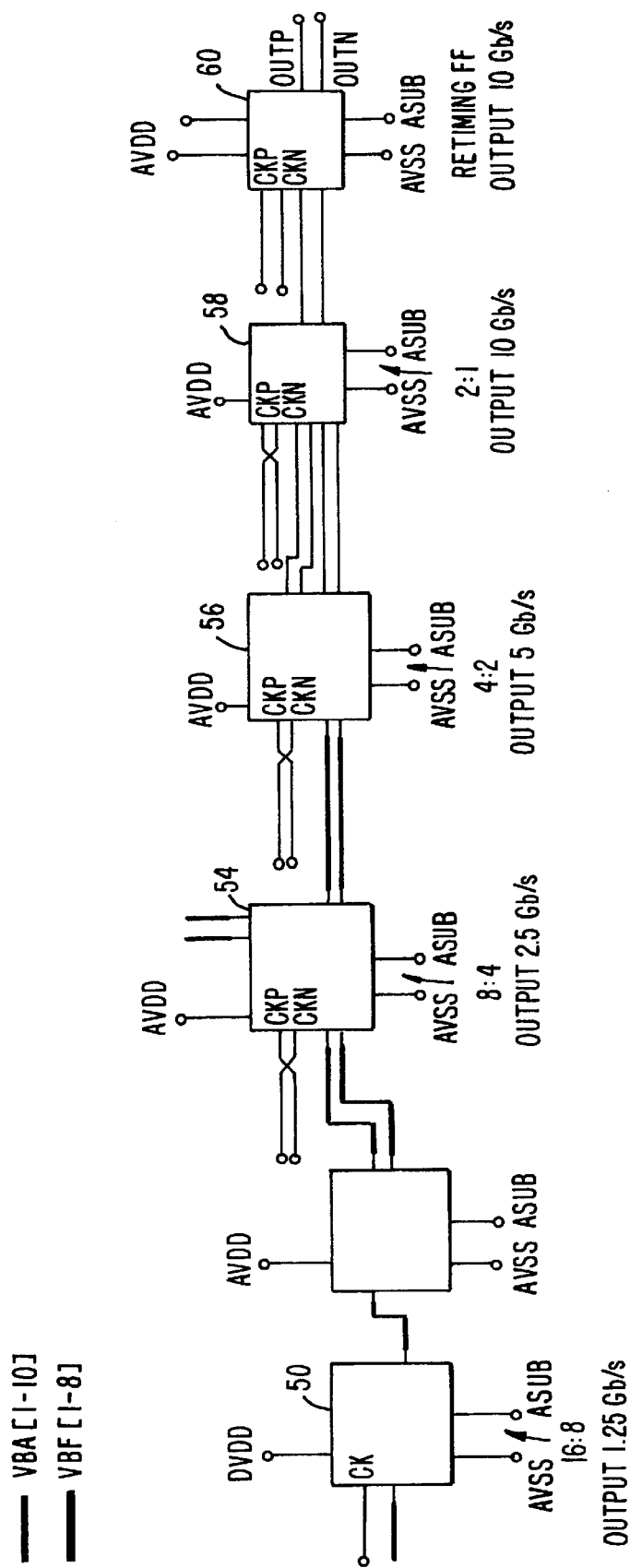
FIG. 6(a) is a schematic diagram of a serializer circuit utilizing features of the invention.

FIG. 6(a) shows an exemplary 16:1 serializer according to the present invention. The serializer includes a 16:8 multiplexer 50 that converts the data rate to 1.25 Gb/s, followed by an 8:4 multiplexer 54 that converts the data rate to 2.5 Gb/s. The 2.5 Gb/s data is further converted to a 5 Gb/s data by a 4:2 multiplexer 56, and finally to a 10 Gb/s data by a 2:1 multiplexer 58. A flip flop 60 at the output re-times the 10 Gb/s data to generate the final output data stream.

According to this embodiment of the invention, the circuit of FIG. 6(a) may combine conventional CMOS logic used for the lower speed multiplexers and core processing circuitry, with C³MOS logic for the mid-rate multiplexers, and C³MOS logic with inductive broadbanding for the highest speed multiplexer (i.e., the 2:1 multiplexer 58) as well as the output re-timing flip flop 60.

As illustrated by the various C³MOS with inductive broadbanding logic elements described below, all of the building blocks of any logic circuitry can be constructed using the C³MOS with inductive broadbanding technique of the present invention. More complex logic circuits such as shift registers, counters, frequency dividers, etc., can be constructed in C³MOS with inductive broadbanding using the basic elements described above. As mentioned above, however, both C³MOS and C³MOS with inductive broadbanding logic does consume static power. Additionally, the fabrication of C³MOS with inductive broadbanding logic is more expensive than C³MOS or CMOS because of the need to add inductors to the IC.

The static current dissipation of C³MOS and/or C³MOS with inductive broadbanding may become a limiting factor in certain large scale circuit applications. In one embodiment, as depicted for example in FIGS. 5 and 6(a), the present invention combines C³MOS with inductive broadbanding and C³MOS logic with conventional CMOS logic to achieve an optimum balance between speed and power consumption. According to this embodiment of the present invention, an integrated circuit utilizes C³MOS with inductive broadbanding logic for the ultra high speed (e.g., 10 Gb/s) portions of the circuitry, C³MOS for very high speed parts of the circuit (e.g., 2.5–5 Gb/s), and conventional CMOS logic for the relatively lower speed sections. For example, to enable an integrated circuit to be used in ultra high speed applications, the input and output circuitry that interfaces with and processes the high speed signals is implemented using C³MOS with inductive broadbanding. The circuit also employs C³MOS to divide down the frequency of the signals being processed to a low enough frequency where conventional CMOS logic can be used. The core of the circuit, according to this embodiment, is therefore implemented by conventional CMOS logic that consumes zero static current.

Figure 6B:
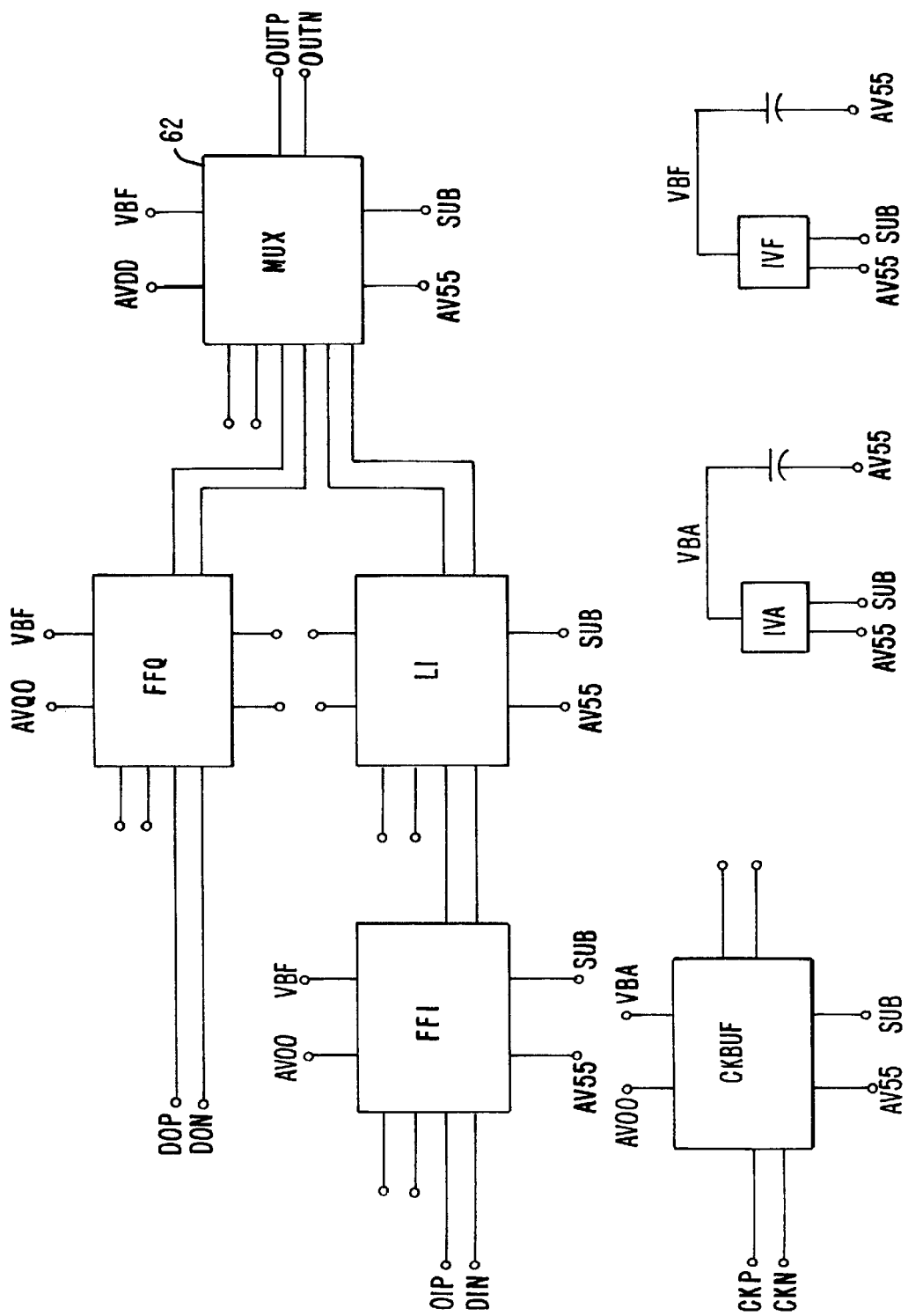
FIG. 6(b) is a more detailed depiction of the 2:1 MUX depicted in FIG. 6(a)
Figure 7:
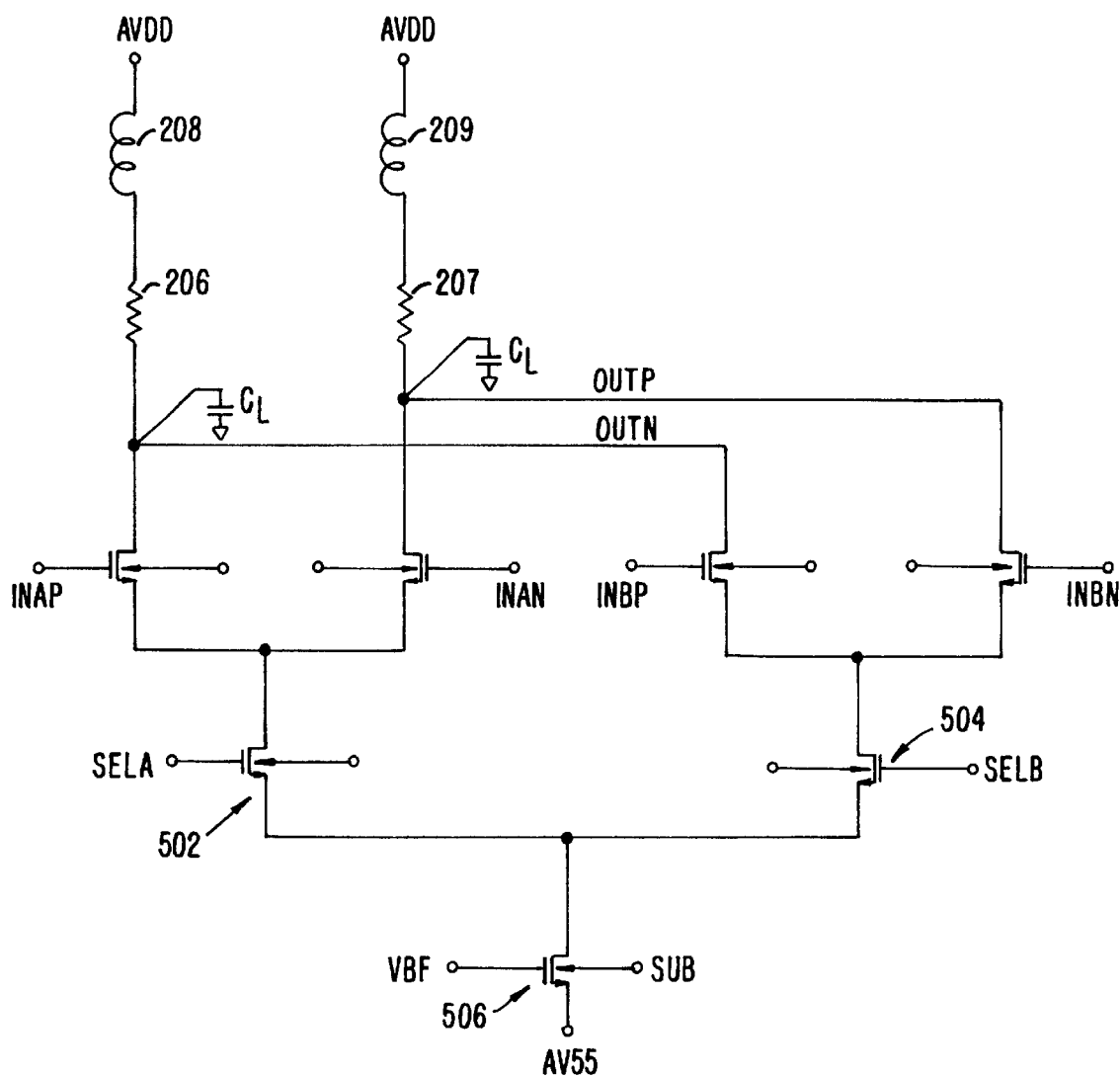
FIG. 7 is a circuit diagram of a MUX utilizing features of the present invention.

FIG. 6(b) shows an implementation of the 2:1 multiplexer 58 wherein the actual output multiplexing circuit 62 uses C³MOS with inductive broadbanding an implementation of which is shown in FIG. 7.

FIG. 7 shows an exemplary C³MOS with inductive broadbanding implementation for a 2:1 multiplexer 62. Similar to the other C³MOS logic gates, multiplexer 62 includes a differential pair for each input. The positive (left) input transistor of each differential pair is coupled to VDD through by a first resistor 206 connected in series with a first series inductor 208 and the negative (right) input transistor of each differential pair is coupled to VDD through by a second resistor 207 connected in series with a second series inductor 209. The multiplexer 62 further includes select transistors 502 and 504 inserted between the common source terminals of the differential pairs and the current source transistor 506. By asserting one of the select input signals SELA or SELB, the bias current is steered to the differential pair associated with that select transistor. Thus, signal SELA steers the bias current to the differential pair with AP and AN inputs, and signal SELB steers the bias current to the differential pair with BP and BN inputs.

Figure 8:
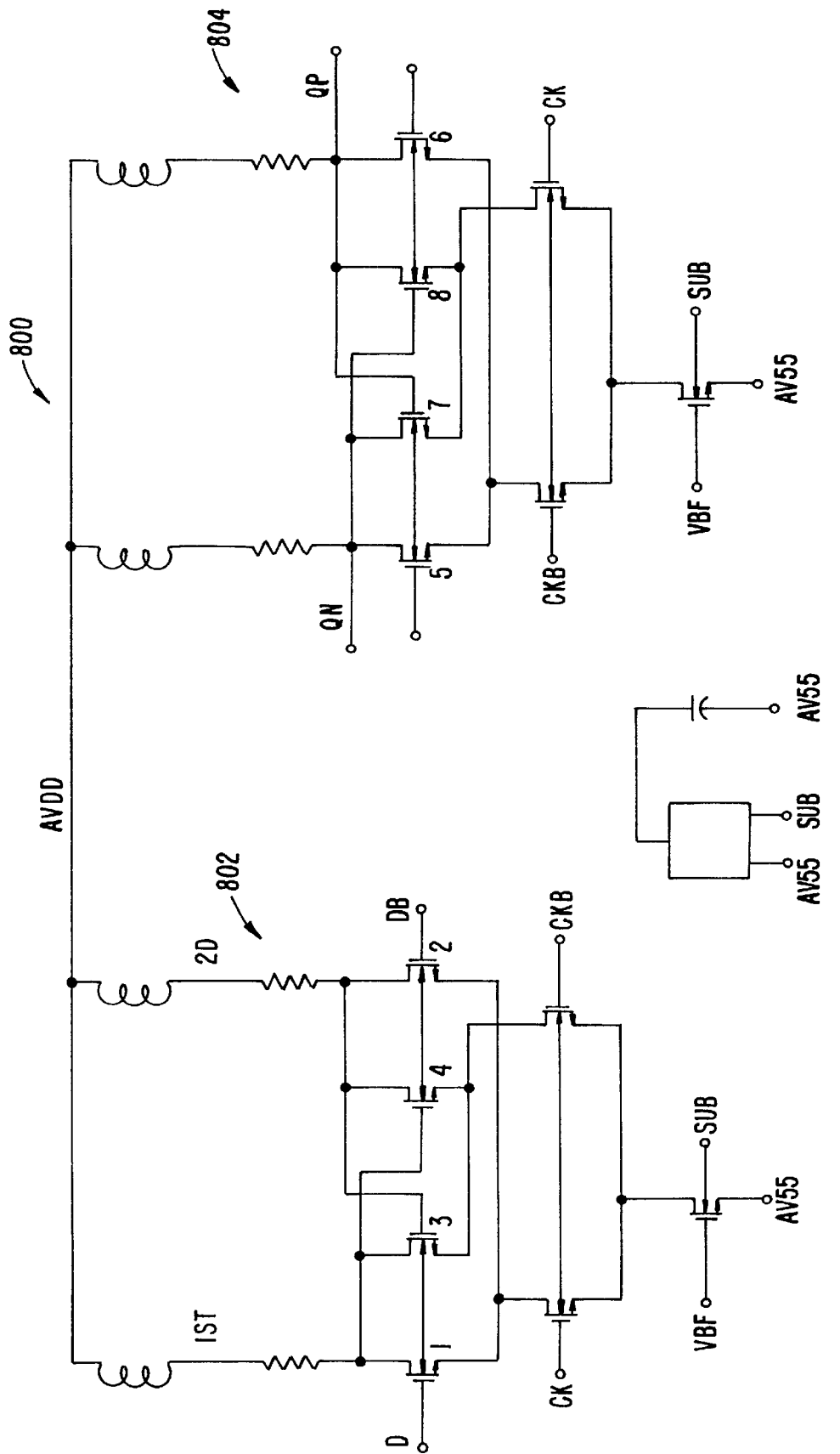
FIG. 8 is a circuit diagram of a flip-flop utilizing features of the invention.

FIG. 8 shows an exemplary implementation of a C³MOS flip flop with inductive broadbanding for use as the re-timing flip flop in the serializer of FIG. 5. A C³MOS master-slave flip-flop 800 according to the present invention can be made by combining two latches 802 and 804. A first latch 802 receives differential input signals D and $\overline{D}$ and generates differential output signals QI and $\overline{QI}$. The differential output signals QI and $\overline{QI}$ are then applied to the differential inputs of a second latch 804. The differential outputs Q and $\overline{Q}$ of second latch 804 provide the outputs of flip-flop 800. The input transistors of each latch are coupled to VDD by a resistor and shunt inductor coupled in series.

It is to be understood that all C³MOS logic elements, numerous examples of which are described on the above-referenced commonly-assigned patent application, can employ the inductive broadbanding technique according to the present invention.

Figure 9:
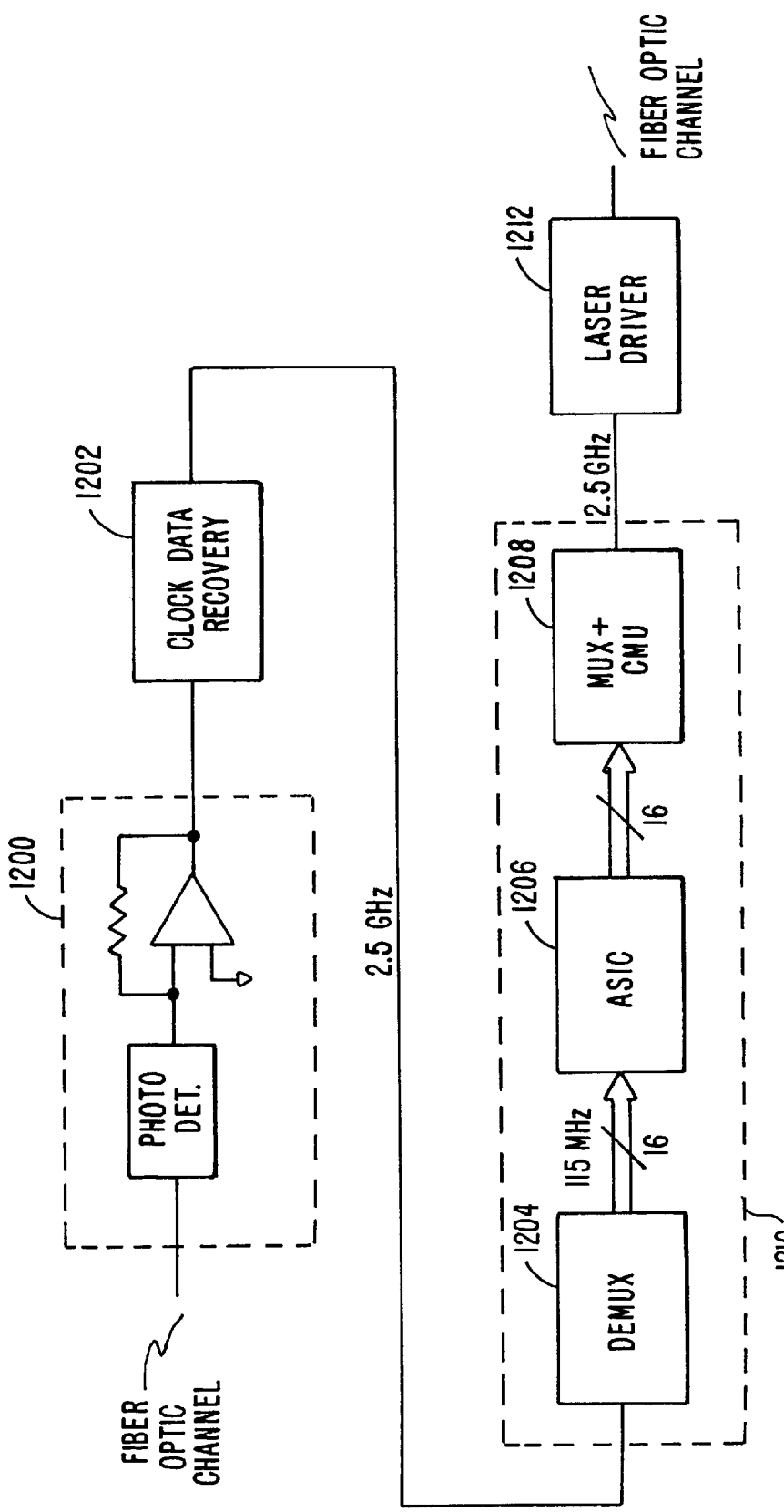
FIG. 9 is a simplified block diagram of a transceiver system that utilizes the C³MOS with inductive broadbanding/C³MOS/CMOS combined logic according to the present invention to facilitate interconnecting high speed fiber optic communication channels.

According to one embodiment of the present invention the combined C³MOS with inductive broadbanding/C³MOS/CMOS circuit technique is employed in a transceiver of the type illustrated in FIG. 9. The exemplary transceiver of FIG. 9 is typically found along fiber optic channels in high speed telecommunication networks. The transceiver includes at its input a photo detect and driver circuit 1200 that receives the input signal from the fiber optic channel. Circuit 1200 converts fiber-optic signal to packets of data and supplies it to a clock data recovery (CDR) circuit 1202. CDR circuit 1202 recovers the clock and data signals that may be in the frequency range of about 10 GHz, or higher. Established telecommunication standards require the transceiver to perform various functions, including data monitoring and error correction. These functions are performed at a lower frequency. Thus, the transceiver uses a demultiplexer 1204, depicted in FIGS. 5 and 6, which deserializes the 10 Gb/s data stream into, for example, 16 parallel signals having a bit rate of about 622 Mb/s. An application specific integrated circuit (ASIC) 1206 then performs the monitoring and error correction functions at the lower (622 Mb/s) bit rate. A multiplexer and clock multiplication unit (CMU) 1208 converts the parallel signals back into a single bit stream at 10 Gb/s. This signal is then retransmitted back onto the fiber optic channel by a laser drive 1212. The combined C³MOS with inductive broadbanding/C³MOS/CMOS technique of the present invention allows fabrication of demultiplexer 1204, ASIC 1206 and multiplexer and CMU 1208 on a single silicon die. That is, demultiplexer 1204 and multiplexer and CMU 1208 are implemented in C³MOS with inductive broadbanding/C³MOS with ASIC 1206 implemented in conventional CMOS.

In conclusion, the present invention provides various circuit techniques for implementing ultra high speed circuits using current-controlled CMOS (C³MOS) logic and C³MOS with inductive broadbanding logic fabricated in conventional CMOS process technology. In one embodiment, the present invention advantageously combines high speed C³MOS with inductive broadbanding/C³MOS with inductive broadbanding/C³MOS logic with low power conventional CMOS logic. According to this embodiment circuits such as transceivers along fiber optic channels can be fabricated on a single chip where the ultra-high speed portions of the circuit utilize C³MOS with inductive broadbanding/C³MOS and the relatively lower speed parts of the circuit use conventional CMOS logic.

While the above is a complete description of the preferred embodiment of the present invention, it is possible to use various alternatives, modifications and equivalents. For example, although spiral inductors and poly resistors are utilized in the preferred embodiment other techniques known to persons of skill in the art can be utilized Therefore, the scope of the present invention should be determined not with reference to the above description but should, instead, be determined with reference to the appended claims, along with their full scope of equivalents.

What is claimed is:

1. A current-controlled metal-oxide-semiconductor field-effect transistor (MOSFET) circuit fabricated on a silicon substrate, comprising:

first and second n-channel MOSFETs having their source terminals coupled to a first node, their gate terminals coupled to receive a first and second differential logic signals, respectively, and their drain terminals coupled respectively to first and second output nodes;

first and second series RL circuits respectively coupled between said first and second output nodes and a logic high level;

first and second capacitive loads ($C_L$) respectively coupled to said output nodes; and a current-source n-channel MOSFET coupled between the source terminals of the first and second select n-channel MOSFETs and a logic low level.

2. The circuit of claim 1 wherein:

the magnitude of $C_L$, R, and L are about equal to values determined by the relation $L=(0.35)*C_L R^2$.

3. A current-controlled metal-oxide-semiconductor field-effect transistor (MOSFET) circuit fabricated on a silicon substrate, comprising:

a multiplexing circuit including:

first and second n-channel MOSFETs having their source terminals coupled to a first node, their gate terminals coupled to receive a first pair of differential logic signals, respectively, and their drain terminals coupled to a true output and a complementary output, respectively;

third and fourth n-channel MOSFETs having their source terminals coupled to a second node, their gate terminals coupled to receive a second pair of differential logic signals, and their drain terminals coupled to the true output and a complementary output, respectively;

first and second RL series circuits respectively coupling the true output and the complementary output to a logic high level;

a first select n-channel MOSFET having a drain terminal coupled to the first node, a gate terminal coupled to receive a first select logic signal, and a source terminal; and a second select n-channel MOSFET having a drain terminal coupled to the second node, a gate terminal coupled to receive a second select logic signal, and a source terminal.

4. The circuit of claim 3 further comprising:

first and second capacitive loads, $C_L$, coupled, respectively, the true and complementary outputs, wherein the magnitude of $C_L$, R, and L are about equal to values determined by the relation $L=(3.5)*C_L R^2$.

5. The MOSFET circuit of claim 8 wherein the circuit comprises a transreceiver, the transreceiver comprising:

a first input deserializer implemented by the C³MOS with inductive broadbanding logic, and configured to receive the input signal having the first frequency and to generate a plurality of parallel first signals at the second frequency;

a second input deserializer implemented by the C³MOS logic, and configured to receive the first output having the second frequency and to generate a plurality of parallel third signals at the third frequency;

core circuitry implemented by the CMOS logic, and coupled to said input deserializer, the core circuitry being configured to process the plurality of parallel signal at the third frequency;

a first output serializer implemented by the CMOS logic, and coupled to said input deserializer, the core circuitry being configured to process the plurality of parallel signal at the third frequency;

a first output serializer implemented by the C³MOS logic, and coupled to the core circuitry, the first output serializer being configured to receive the plurality of parallel signals and to generate a plurality of parallel second output signal at the second frequency; and a second output serializer implemented by the C³MOS with inductive broadbanding logic, and coupled to the first output serializer, the second output serializer being configured to receive the plurality of parallel second signals and to generate a single output signal at the first frequency.

6. The circuit of claim 3 further comprising:

first and second capacitive loads, $C_L$, coupld, respectively, the true and complementary outputs of said second latch, wherein the magnitude of $C_L$, R, and L are about equal to valuees determined by the relation $L=(3.5)*C_L R^2$.

7. A current-controlled metal-oxide-semiconductor field-effect transistor (MOSTFET) circuit fabricated on a silicon substrate, comprising a flip-flop including:

a first clocked latch comprising:

first and second n-channel MOSFETs having their source terminals connected together, their gate terminals coupled to receive a pair of differential logic signals, respectively, and their drain terminals connected to a first output and a second output, respectively;

a first clocked n-channel MOSFET having a drain terminal coupled to the source terminals of the first and second n-channel MOSFETs, a gate terminal coupled to receive a first cloack signal CK, and a source terminal;

third and fourth n-channel MOSFETs having their source terminals coupled together, their gate terminals and drain terminals respectively cross-coupled to the first output and the second output;

a second cloacked n-channel MOSFET having a drain terminal coupled to the source terminals of the third and fourth n-channel MOSFETs, a gate terminal coupled to receive a second clock signal CKB, and a source terminal;

first and second RL series circuits respectively coupling the first output and the second output to a logic high level; and a second clocked latch comprising:
- fifth and sixth n-channel MOSFETs having their source terminals connected together, their gate terminals coupled to receive a pair of differential logic signals, respectively, and their drain terminals connected to a third output and a fourth output, respectively;
- a third clocked n-channel MOSFET having a drain terminal coupled to the source terminals of the fifth and sixth n-channel MOSFETs, a gate terminal coupled to receive a second clock signal CKB, and a source terminal;
- seventh and eight n-channel MOSFETs having their source terminals coupled together, their gate terminals and drain terminals respectively cross-coupled to the third output and the fourth output;
- a fourth clocked n-channel MOSFET having a drain terminal coupled to the source terminals of the seventh and eight n-channel MOSFETs, a gate terminal coupled to receive a first clock signal CK, and a source terminal;
- third and fourth RL series circuits respectively coupling the third output and the fourth output to a logic high level;
- wherein, the gate terminals of the fifth and sixth n-channel MOSFETs in the second clocked latch respectively couple to the first output and the second output of the first clocked latch.

8. A metal-oxide-semiconductor field-effect transistor (MOSFET) circuit fabricated on a silicon substrate, comprising:

a first circuitry implemented, including first and second output nodes and power supply nodes, using current-controlled complementary metal-oxide semiconductor ($C^3MOS$) with inductive broadbanding logic wherein logic levels are signaled by current steering in one of two or more bracnhes in response to differential output signals, and wherein first and second series connected RL circuits couple, respectively, the first and second output nodes to a power supply node, the first circuitry being configured to receive an input signal having a first frequency and to generate a first output signal having a second frequency lower than the first frequency;

second circuitry implemented using current-controlled complementary metal-oxide semiconductor ($C^3MOS$) logic wherein logic levels are signaled by current steering in one of two or more branches in response to differential input signals, the second circuitr being configured to receive said first output signals and to generate a second output signal having a third frequency lower than the second frequency; and third circuitry implemented using coventional complementary metal-oxide-semiconductor (CMOS) logic wherein substantially zero static current is dissipated, the third circuitry being configured to receive and process the second output signal having the third frequency.

9. The MOSFET circuit of claim 8, wherein the first circuitry comprises an input circuit that is implemented using the ($C^3MOS$) with inductive broadbanding logic, and is configured to deserialize the input signal into a plurality of lower frequency signals.

* * * * *

UNITED STATES PATENT AND TRADEMARK OFFICE
CERTIFICATE OF CORRECTION

PATENT NO. : 6,340,899 B1 Page 1 of 1
DATED : January 22, 2002
INVENTOR(S) : Green It is certified that error appears in the above-identified patent and that said Letters Patent is hereby corrected as shown below:

Title page,
Item [57], ABSTRACT, please delete "achieve" and insert therefor -- achieved --.

Column 8,
Line 13, please delete "(3.5)" and insert therefor -- (.35) --.
Lines 14-43, please renumber claim "5" to -- 9 -- and move the claim to the end of Column 10, first deleting lines 29-32 in their entirety, and, at line 37, deleting "signal" and inserting therefor -- signals --, and, at line 14, changing "8" to -- 7 --.
Lines 44-49, please renumber claim "6" to -- 5 -- and move the claim to follow claim 4, first deleting "coupld" and inserting therefor -- coupled --, and, following "respectively", please insert -- to --, please delete "(3.5)" and insert therefor -- (.35) --.
Lines 50-66, please renumber claim "7" to -- 6 --.
Line 63, please delete "cloack" and insert therefor -- clock --.

Column 9,
Line 3, please delete "cloacked" and insert therefor -- clocked --.
Lines 23 and 29, please delete "eight" and insert therefor -- eighth --.

Column 10,
Line 1, please renumber claim "8" to -- 7 --.
Line 9, please delete "bracnhes" and insert therefor -- bracches --.
Line 9, please delete "output" and insert therefor -- input --.
Line 21, please delete "circuitr" and insert therefor -- circuitry --.
Line 22, please delete "signals" and insert therefor -- signal --.
Line 31, please renumber claim "9" to -- 8 --.
Line 31, please delete "8" and insert therefor -- 7 --.

Signed and Sealed this

Twentieth Day of May, 2003

JAMES E. ROGAN
*Director of the United States Patent and Trademark Office*